United States Patent
Sung

[19]

[11] Patent Number: 5,892,683
[45] Date of Patent: Apr. 6, 1999

[54] PROGRAM COMPATIBILITY RECOGNITION FOR A PROGRAMMABLE LOGIC DEVICE

[75] Inventor: Chiakang Sung, Milpitas, Calif.

[73] Assignee: Altera Coporation, San Jose, Calif.

[21] Appl. No.: 679,932

[22] Filed: Jul. 15, 1996

Related U.S. Application Data

[63] Continuation of Ser. No. 40,692, Mar. 31, 1993, abandoned.

[51] Int. Cl.$^6$ .................................................. G06F 17/50
[52] U.S. Cl. ........................ 364/488; 364/489; 380/20; 395/500; 395/568; 371/22.2
[58] Field of Search .................................. 395/500, 568; 380/4, 20, 44, 47; 364/DIG. 1, 489, 488; 371/22.2

[56] References Cited

U.S. PATENT DOCUMENTS

| | | | |
|---|---|---|---|
| 3,609,697 | 9/1971 | Blevins | 340/172.5 |
| 4,118,789 | 10/1978 | Casto et al. | 364/900 |
| 4,384,326 | 5/1983 | Devchaudhury | 364/200 |
| 4,488,261 | 12/1984 | Ueno et al. | 365/104 |
| 4,590,552 | 5/1986 | Guttag et al. | |
| 4,642,487 | 2/1987 | Carter | 307/465 |
| 4,685,056 | 8/1987 | Bainsdale, Jr. et al. | 364/200 |
| 4,688,169 | 8/1987 | Joshi . | |
| 4,812,675 | 3/1989 | Goetting | 307/443 |
| 4,862,452 | 8/1989 | Milton et al. | 370/62 |
| 5,018,146 | 5/1991 | Sexton | 371/37.1 |
| 5,099,516 | 3/1992 | Durkin et al. | 380/4 |
| 5,128,559 | 7/1992 | Steele | 307/465 |
| 5,157,781 | 10/1992 | Harwood et al. | 395/575 |
| 5,256,918 | 10/1993 | Suzuki . | |
| 5,406,627 | 4/1995 | Thompson et al. | 380/20 |

OTHER PUBLICATIONS

*Altera EPC1213 Configuration EROM Programming Specification Core Document*, Dec. 1, 1992, pp. 3 of 9 and 4 of 9.

Primary Examiner—Kevin J. Teska
Assistant Examiner—Thai Phan
Attorney, Agent, or Firm—Townsend and Townsend and Crew LLP

[57] ABSTRACT

A program compatibility recognition system for an integrated circuit. A programming device 4, including programming software 8, is used to program an integrated circuit 2 such as a field programmable gate array. The programming device provides a revision code 12 to a detection circuit 10 on the integrated circuit. The detection circuit determines if the revision code indicates that the software is compatible with the integrated circuit and, if so, generates an appropriate control signal to permit the programming device to program the integrated circuit.

28 Claims, 2 Drawing Sheets

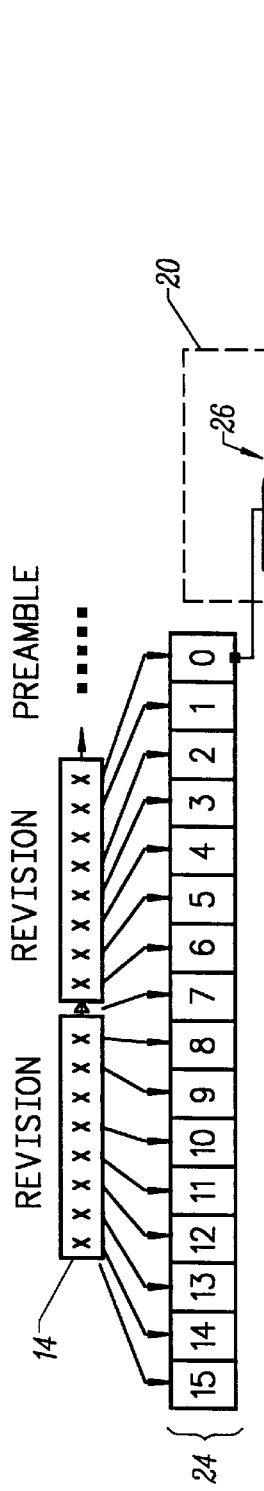
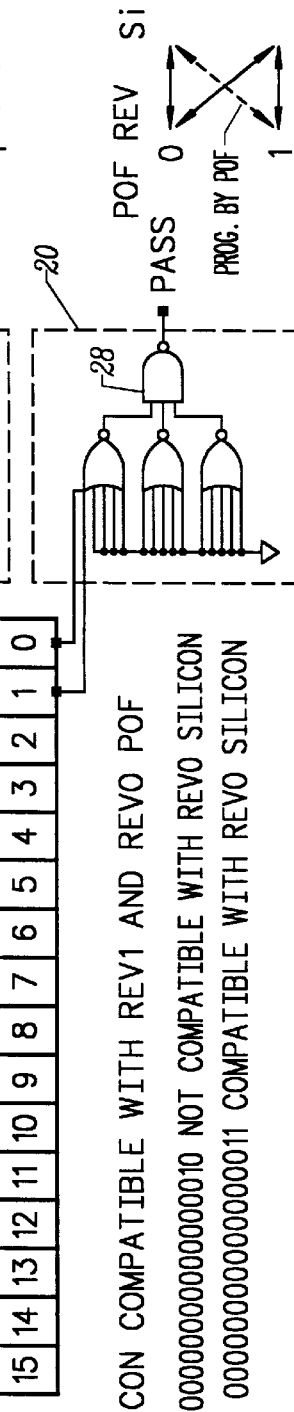
FIG. 3A
CASE 1: REV0 SILICON COMPATIBLE WITH REV0 POF
REV0 POF: 0000000000000001
FIG. 3B
CASE 2: REV1 SILICON COMPARIBLE WITH REV1 POF, NOT REV0 POF
REV1 POF: 0000000000000010 NOT COMPATIBLE WITH REV0 SILICON
REV1 POF: 0000000000000011 COMPATIBLE WITH REV0 SILICON
FIG. 3C
CASE 3: REV1 SILICON COMPATIBLE WITH REV1 AND REV0 POF
REV1 POF: 0000000000000010 NOT COMPATIBLE WITH REV0 SILICON
REV1 POF: 0000000000000011 COMPATIBLE WITH REV0 SILICON

PROGRAM COMPATIBILITY RECOGNITION FOR A PROGRAMMABLE LOGIC DEVICE

This is a Continuation of application Ser. No. 08/040,692, filed Mar. 31, 1993, now abandoned.

BACKGROUND OF THE INVENTION

The present invention relates to the field of integrated circuits, their manufacture, and use. More specifically, in one embodiment the invention provides an improved method and device for ensuring that an integrated circuit is compatible with a configuration program. The invention has application to an array of integrated circuits such as programmable logic devices, otherwise referred to as PLDs, PALs, PLAs, FPLAs, EPLDs, EEPLDs, LCAs, and FPGAs.

Many types of integrated circuits are programmed by an external device such as a computer. As such integrated circuits are modified, updated, and improved, they undergo various revisions. At the same time, it sometimes becomes necessary to make revisions to the external programming device to accommodate changes in the integrated circuit and to otherwise improve the programming device. Such changes are often accomplished through revisions in the software of the external programming device.

As the software and integrated circuits undergo various revisions, it is necessary to "keep track" of the revisions such that it is possible to ensure that a particular revision of the software is compatible with a particular revision of the integrated circuit. This has often presented a difficult problem.

Various solutions have been proposed to accomplish this task. For example, certain programmable logic devices have applied a predetermined signal to one or more pins on the programmable logic device, and this signal causes the device to generate an ID code as a binary signal along one or more separate pins on the device. This binary code is generated by way of a ROM field on the chip, and is read by the programming device and its associated software. Depending upon the value of the binary code, the programming software may utilize a different programming algorithm to program the device.

While meeting with substantial success, prior techniques for managing revisions of integrated circuits and their programming software have also met with significant limitations. For example, when the software and the integrated circuit are incompatible, the programming effort will fail, but it is often difficult to determine why the failure has occurred. This problem arises because the output of the integrated circuit indicates which revision of the code to use, but if the code does not have that particular revision available, there is often an unidentifiable failure. Therefore, the user may not be aware that the failure arose due to incompatibility of the software and the integrated circuit. Moreover, the programmer of the software has limited control over upward and downward compatibility of the various revisions of the software.

Some types of integrated circuits have programming elements made of SRAM. The programming process of physically loading the SRAM data into the integrated circuit is called "configuration." The configuration data sometimes is stored in a "dumb" memory device, such as a low-cost EPROM, when the system does not equip a host computer as an intelligent programming controller. Usually it is advantageous to have the device configuration occur automatically at system power-up. In this case, during power-up, the EPROM device starts "blindly" sending data to the SRAM-based IC, and it is the responsibility of the device to be configured (i.e., the SRAM-based device) to determine the program compatibility. Prior techniques did not work well when a system lacked a host computer for intelligent control, and the programming device was so "dumb" that a hand-shaking with the device being programmed did not exist. This invention also provides a means to recognize a program compatibility for in-circuit or on-board configuration (with or without a host computer).

From the above it is seen that an improved method and system for program/integrated circuit compatibility is needed.

SUMMARY OF THE INVENTION

An improved system and method of providing program compatibility recognition is provided by virtue of the present invention.

According to one aspect of the invention, a revision compatibility detection circuit is provided on an integrated circuit. A storage media for storing a revision code is also provided on the integrated circuit. The programming device inputs a binary code indicative of the device revisions that are supported by the software. The revision compatibility detection circuit determines if the device is one of those supported by the software and, if so, outputs an appropriate signal indicative of this fact and permit programming. Optionally, the device may output a signal indicating that there has been a failure due to incompatibility of the programming software and the integrated circuit device.

Accordingly, in one embodiment the invention provides a system for programming a programmable logic device integrated circuit. The system includes a programming computer, the programming computer including integrated circuit programming software stored therein, the programming software adapted to generate a series of bits at an output of the programming device representing compatible integrated circuits; and a detection circuit in the programmable logic device, the detection circuit generating a signal permitting programming of the programmable logic device by the programming computer when the series of bits is of a predetermined pattern.

A further understanding of the nature and advantages of the inventions herein may be realized by reference to the remaining portions of the specification and the attached drawings.

BRIEF DESCRIPTION OF THE DRAWINGS

FIG. 3A schematically illustrates the integrated circuit when the software must be compatible with revision 0 silicon;

FIG. 3B schematically illustrates the integrated circuit when the software must be compatible with revision 1 silicon, and the revision 0 software is not compatible; and FIG. 3C schematically illustrates the integrated circuit when the software must be compatible with either revision 1 or revision 0 silicon.

DESCRIPTION OF THE PREFERRED EMBODIMENTS

The present invention is used to determine the compatibility between the revisions of an integrated circuit such as a FPGA device and a configuration program. A device revision code is "built in" to the device and serves as a silicon identification code. The configuration program can be specified by a programmer, in a revision field, to randomly select which device revision will be compatible with the program.

When loading a configuration program the integrated circuit checks the revision field. If this software is compatible the configuration program is permitted to be loaded into the integrated circuit. If not, the programming device is notified and the loading process is stopped. In a specific embodiment, the integrated circuit includes a 24 bit shift register and a NOR-NAND type decoder that determines compatibility. The first 8 bits of the shift register may be used as a preamble code detector. The rest of the 16 bits represent the compatibility of revisions of the configuration program to the integrated circuit.

The 24 bits of data are specified by the programmer in the configuration program. The 8 bit preamble code is determined by the manufacturer of the FPGA device to ensure that the device is of the correct brand. The rest of the 16 bits are set by the programmer. Each bit represents whether a particular revision of a configuration program is compatible with the programmable logic device or other integrated circuit device. For example, if the programmer specifies 0000001100111001 in the revision field, each bit may be individually representative of whether the software will be compatible with a particular revision of the integrated circuit. In this particular example, the farthest most right bit indicates that the software is compatible with revision 0 of the integrated circuit. The next bit to the left, with a "0" value, indicates that the software will not be compatible with the first revision of the integrated circuit. In total, the above code indicates that the software is designed to be compatible with revisions 0, 3, 4, 5, 8, and 9 of the integrated circuit. When used with appropriate revision decoders on the integrated circuit, both forward and backward compatibility can be achieved. If a configuration program specifies all 1's in the revision field, the system is effectively disabled by the programmer since the program is indicated to be compatible with all integrated circuit revisions.

Figure 1:
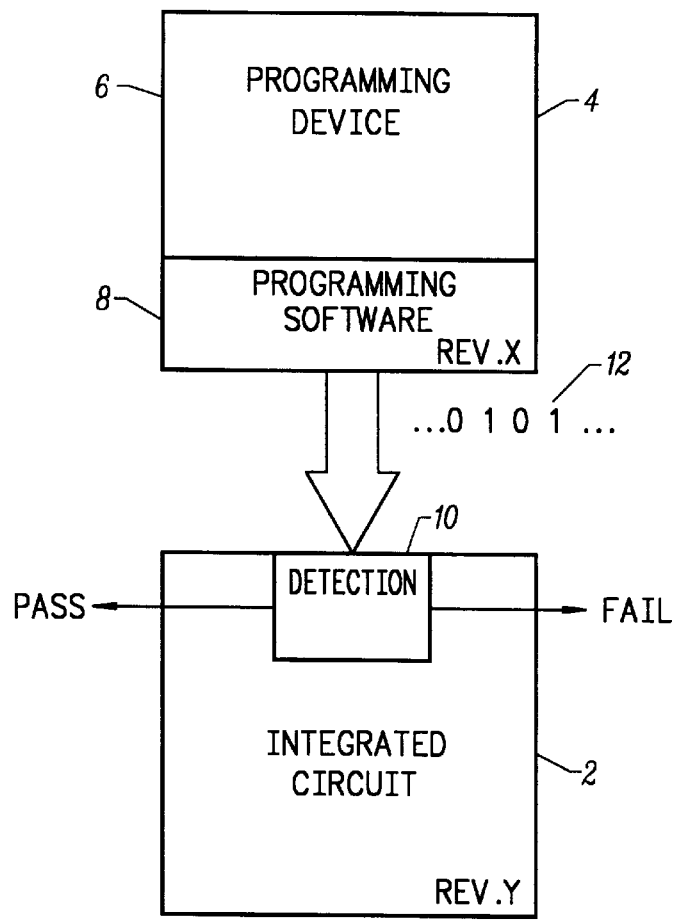
FIG. 1 is an overall illustration of one embodiment of the invention.

FIG. 1 illustrates an integrated circuit 2 and programming system 4 according to one embodiment of the invention. The programming system will generally include programming hardware 6 that is controlled by appropriate programming software 8, generally stored in memory associated with the computer. In many embodiments, the programming hardware will include a computer such as an IBM PC compatible computer, preferably a computer such as a 386 or 486 based IBM PC-AT, PS/2, or similar computer, a programming adapter, and other peripherals. Programming software and hardware used, for example, in conjunction with programmable logic devices are well known and generally described in the Altera 1992 Data Book, September 1991, pgs. 267–364, incorporated herein by reference for all purposes.

The programming system 4 can also be represented by a nonvolatile memory device, such as Altera EPC1213 configuration EPROM, which stores the data to be programmed including the software revision X.

The integrated circuit 2 includes a detection circuit 10 that is used to determine if the particular software used by the programming device is of a revision that is compatible with the particular revision of the integrated circuit device. For example, in FIG. 1, the software is of revision X, while the integrated circuit is of revision Y. If revision X is compatible with revision Y, an appropriate signal PASS is generated by the integrated circuit, preferably by the detection circuit. Optionally, if the revision X is not compatible with the revision Y, an signal FAIL is generated by the integrated circuit/detection circuit.

In a preferred embodiment, the detection circuit determines if the software revision and the integrated circuit revision are compatible by appropriate processing of a binary code 12 passed to the integrated circuit by the programming device. The binary code may be passed to the integrated circuit along with other programming information, or may be passed alone.

Figure 2:
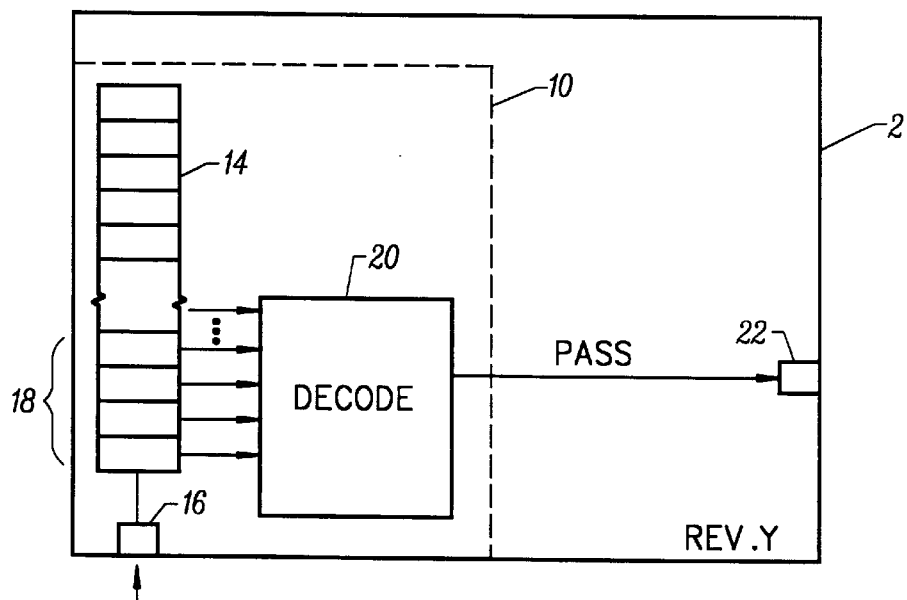
FIG. 2 illustrates aspects of an integrated circuit according to one embodiment of the invention in greater detail.

FIG. 2 illustrates a preferred embodiment of an integrated circuit 2. As shown therein the detection circuit 10 includes a shift register or other storage device 14. The storage device receives signals from the programming device directly or indirectly from one or more pins 16. Data representing, among other things, a revision code are loaded by the programming device into the shift register 14. The data from at least the revision code field 18 are then decoded in a decoder circuit 20 to determine if the software is compatible with the particular revision of the integrated circuit. If the decoder circuit determines that the integrated circuit revision is compatible with the configuration software based on the data stored in the revision field, the decoder issues a PASS signal to, for example, an internal device location that then permits loading of additional data onto the device and/or to a pin or pins 22 on the integrated circuit. A fail condition may be indicated simply by the lack of a PASS signal or, in alternative embodiments, the decode circuit may issue a separate, distinguishable signal indicating a fail condition on the pin 22 or a separate pin. Similarly, although not shown for purposes of simplicity, the device may also include a preamble comparator/decoder that ensure that the device is of the correct type and manufacturer for the software.

FIGS. 3A to 3C illustrate various possibilities for establishing compatibility of the silicon and the software, along with a particular decode circuit 20. In the Figures, the series of 16 bits are revision bits stored in the shift register 14. The right most bit (0) is used to indicate whether the software is intended for use with revision 0 of the integrated circuit, the next bit (1) is used to indicate whether the software is compatible with revision 1 of the integrated circuit, and so on. In this particular embodiment, a high value in a bit is used to indicate that the software supports the particular revision while a low value is used to indicate that the software does not support a particular revision. For example, storing a 1 in bit 0 will indicate that the software supports revision 0 of the integrated circuit, while storing a 0 for bit 0 will indicate that the software does not support revision 0. Obviously, the reverse arrangement could easily be utilized without departing from the scope of the invention herein. In this particular embodiment, the revision field is 16 bits long.

FIG. 3A illustrates implementation of the decoding circuit when the programmable logic device is revision 0. As shown, the bit stored in the 0 position of the shift register is connected to one of the 16 inputs of NOR gates 26. The remaining inputs of the NOR gates are coupled to ground. Although a single NOR gate may be used, in this particular embodiment the various inputs are dispersed among three NOR gates, the outputs of which are input to a NAND gate 28. The output of the NAND gate 28 is utilized as a PASS signal. The PASS signal will be high in the particular embodiment shown in FIG. 3 when the software programmer has determined that the programming software should be compatible with revision 0 of the integrated circuit by placing a high value in bit 0. Conversely, PASS will be low when bit 0 is provided with a low value.

The value of all bits except bit 0 will have no impact on the device shown in FIG. 3A. Regardless of how many revisions of the integrated circuit are produced and regardless of how many revisions of the programming software are produced, the programmer may always indicate that the software is compatible with revision 0 by placing a high level value in the 0 bit.

FIG. 3B illustrates the situation with revision 1 of the integrated circuit. In this particular embodiment, the NOR gates are provided with input from only bit 1. Accordingly, when bit 1 is high, the programming device will be enabled by PASS; otherwise it will not. Since the revision 0 software has a 0 in bit 1, which is used as an input to the NOR gates, the circuit designer has provided that revision 0 software will not be compatible with this integrated circuit. Note, however, that revision 1 software can be indicated by the programmer to be compatible with revision 0 of the integrated circuit, as well as revision 1 of the integrated circuit, by providing output of 1's in both the 0 and 1 bit positions. Conversely, the programmer may provide that revision 1 software will not be compatible with revision 0 of the integrated circuit by placing a 0 in the 0 bit position. Accordingly, the programmer may provide or not provide for downward compatibility of the software as he/she sees fit.

This situation is illustrated in the right hand side of FIG. 3b. As shown by solid lines, software revision 0 is compatible with integrated circuit revision 0, and software revision 1 is compatible with integrated circuit revision 1. The decoder permits the programmer to optionally make software revision 1 downward compatible to integrated circuit revision 0, as indicated by the dashed line.

FIG. 3C illustrates another possible configuration for revision 1 of the integrated circuit. As shown therein, the 0 and 1 bits are coupled to the inputs of the NOR gates 26. In this case, the integrated circuit designer has determined that the integrated circuit is to be compatible with both revision 0 and revision 1 software, as indicated by the solid black line on the right of FIG. 3C. In addition, the software programmer may optionally make revision 1 software downward compatible to revision 0 of the integrated circuit by placing a 1 in the 0 bit position, as indicated by the dashed line in FIG. 3C.

As will be appreciated by those of skill in the art, the present invention provides significantly greater control and flexibility over the management of software/programmable logic device revision compatibility.

The above description is illustrative and not restrictive. Many variations of the invention will become apparent to those of skill in the art upon review of this disclosure. Merely by way of example the invention may be used with a larger or smaller number of revision field bits, the invention may be used with devices other than FPGAs, or the invention may be utilized with systems in which the revision field is presented to the device in a parallel fashion on a number of device pins rather than in a serial fashion in which the bits are stored in shift registers. The scope of the invention should, therefore, be determined not with reference to the above description, but instead should be determined with reference to the appended claims along with their full scope of equivalents.

What is claimed is:

1. A system for programming a programmable logic device integrated circuit comprising:

a programming device, said programming device comprising integrated circuit programming software stored therein, said programming software adapted to generate a series of bits at an output of said programming device, said series of bits representing compatible revisions of said programmable logic device integrated circuits, wherein said programming device programs said programmable logic device; and a detection circuit in said programmable logic device, said detection circuit generating a signal permitting programming of said programmable logic device by said programming device when said detection circuit determines at least one bit in a selected bit location of said series of bits is asserted, indicating that said programmable logic device is one of said compatible revisions of said programmable logic device integrated circuits.

2. A system as recited in claim 1 wherein said series of bits comprises:

a revision of said programmable logic device compatible with said software; and a preamble representative of at least product brand compatible with said software.

3. The system for programming a programmable logic device integrated circuit of claim 1 wherein said detection circuit generates said signal permitting programming when said detection circuit receives a disable signal.

4. The system for programming a programmable logic device integrated circuit of claim 3 wherein said disable signal comprises a series of one bits.

5. A system for programming a programmable logic device integrated circuit comprising:

a programming device, said programming device comprising integrated circuit programming software stored therein, said programming software adapted to generate a series of bits at an output of said programming device, representing compatible integrated circuits; and a detection circuit in said programmable logic device, said detection circuit generating a signal permitting programming of said programmable logic device by said programming device when said series of bits is of a predetermined pattern, wherein said detection circuit in said programmable logic device comprises:

a shift register for receiving said series of bits; and a decoder for inputting bits from said shift register and generating said signal permitting programming of said programmable logic device based on said series of bits.

6. A system as recited in claim 5 wherein said decoder comprises at least one NOR gate, said NOR gate coupled to selected locations in said shift register, whereby an output of said NOR gate is at a selected level when at least one stored value in at least one of said selected locations indicates that a revision of software in said programming computer is compatible with a revision of said programmable logic device.

7. A system as recited in claim 5 wherein said decoder comprises a plurality of said NOR gates, outputs of said NOR gates coupled to a NAND gate, wherein said signal permitting programming of said programmable logic device is an output of said NAND gate.

8. A system as recited in claim 5 wherein each of a plurality of positions in said shift register is associated with a device revision, whereby said software indicates compatibility with a device revision by setting said plurality of positions to selected values.

9. A method of configuring a programmable logic device comprising the steps of:

from a programming device, transmitting a plurality of supported logic device revision data bits;

in said programmable logic device, processing said plurality of supported logic device revision bits and generating a pass signal when at least one bit of said revision bits represents that said programmable logic device is a revision of said integrated circuit compatible with a revision of said programming device; and when said pass signal is generated, permitting said programming device to configure said programmable logic device.

10. The method as recited in claim 9 wherein said programming device is a personal computer comprising a revision of programming software.

11. The method as recited in claim 9 wherein the programming device is a nonvolatile memory device.

12. A method as recited in claim 9 wherein said step of processing said plurality of logic device revision bits comprises the steps of:

inputting said logic device revision bits to a shift register; and decoding said logic device revision bits to generate said pass signal.

13. The method as recited in claim 12 wherein the step of decoding comprises the step of:

inputting selected ones of said revision bits to inputs of a NOR gate, an output of said NOR gate generating said pass signal.

14. The method as recited in claim 13 wherein said step of inputting selected ones of said revision bits to inputs of a NOR gate further comprises the steps of:

inputting other selected revision bits to inputs of a second NOR gate; and providing outputs of said NOR gates as inputs to a NAND gate, an output of said NAND gate comprising said pass signal.

15. The method of configuring a programmable logic device of claim 9 wherein said processing step generates a pass signal when said programmable logic device receives a disable signal.

16. The method of configuring a programmable logic device of claim 15 wherein said disable signal comprises a series of one bits.

17. A method of configuring a programmable logic device comprising the steps of:

from a personal computer, inputting a serial stream of revision bits to a shift register on said programmable logic device;

storing said revision bits in said shift register;

inputting selected ones of said revision bits in said shift register to one or more NOR gates;

generating a pass signal based on outputs of said one or more NOR gates when at least one of said selected ones of said revision bits are affirmative, indicating said programmable logic device is a compatible revision of said programmable logic device integrated circuit; and when said pass signal is generated, configuring said programmable logic device with said personal computer.

18. A system for programming a programmable logic device integrated circuit comprising:

a programming device, said programming device comprising:

integrated circuit programming software stored therein, said programming software adapted to generate a series of bits at an output of said programming device, wherein said series of bits provides an indication of integrated circuit revisions compatible with said programming software; and in said programmable logic device, a detection circuit, to determine whether said programmable logic device is one of said revisions compatible with said programming software, wherein said detection circuit device comprises:

a register, receiving said series of bits; and a decoder, inputting bits from said register and generating a signal indicating compatibility with said programming software based on a state of at least one bit at a predetermined position in said series of bits.

19. The system of claim 18 wherein when said programming device receives from said detection circuit said signal indicating compatibility, said programmable logic device permits said programming device to configure logical elements within said programmable logic device.

20. The system of claim 18 wherein said series of bits is transmitted serially from said programming device into said register of said programmable logic device.

21. The system of claim 18 wherein said series of bits further comprises a plurality of preamble bits providing an indication of compatible types of programmable logic device.

22. The system of claim 18 wherein based on said series of bits, said decoder generates a signal indicating incompatibility with said programming software when said programmable logic device is not compatible.

23. The system of claim 18 wherein each bit in said series of bits represents a compatible revision of said integrated circuit.

24. The system of claim 18 wherein said programming software provides an indication of compatibility with all integrated circuit revisions when every bit in said series of bits is in a similar logical state.

25. The system of claim 18 wherein said series of bits is input from said register to said decoder in parallel.

26. The system of claim 18 wherein said decoder comprises:

a plurality of NOR gates having a plurality of inputs, wherein each bit in said register is coupled to one of said input; and a NAND gate coupled to outputs of said plurality of NOR gates, said NAND gate generating said signal indicating compatibility with said programming software.

27. The system of claim 18 wherein said decoder comprises an OR gate, wherein each bit in said register is coupled to an input of said OR gate and said OR gate generates said compatibility signal.

28. A method of configuring a programmable logic device comprising the steps of:

transmitting a plurality of revision bits from a programming device;

receiving and processing said plurality of revision bits in said programmable logic device;

generating a pass signal from said programmable logic device when at least one bit of said revision bits indicates said programmable logic device is a revision compatible with programming software stored in said programming device; and when said pass signal is generated, permitting said programming device to configure said programmable logic device.

* * * * *